United States Patent [19]

Tseng

[11] Patent Number: 5,795,822
[45] Date of Patent: Aug. 18, 1998

[54] METHOD FOR MANUFACTURING AN ALIGNED OPENING IN AN INTEGRATED CIRCUIT

[75] Inventor: Horng-Huei Tseng, Hsinchu, Taiwan

[73] Assignee: Vanguard International Semiconductor Corporation, Hsinchu, Taiwan

[21] Appl. No.: 689,353

[22] Filed: Aug. 7, 1996

[51] Int. Cl.[6] .................. H01L 21/302; H01L 21/31
[52] U.S. Cl. .............................. 438/637; 438/635
[58] Field of Search ........................ 438/637, 639, 438/640, 646, 635

[56] References Cited

U.S. PATENT DOCUMENTS

| | | | |
|---|---|---|---|
| 5,266,523 | 11/1993 | Manning | 438/635 |
| 5,279,989 | 1/1994 | Kim | 438/396 |
| 5,330,934 | 7/1994 | Shibata et al. | 438/624 |
| 5,368,682 | 11/1994 | Park | 438/639 |
| 5,663,100 | 9/1997 | Park et al. | 438/586 |

*Primary Examiner*—John Niebling
*Assistant Examiner*—Ha Tran Nguyen
*Attorney, Agent, or Firm*—Christensen, O'Connor, Johnson & Kindness PLLC

[57] ABSTRACT

The present invention relates to a method of forming an aligned opening in a semiconductor device. A polysilicon layer is formed over the device. Then an opening is formed in the polysilicon layer by using patterning and etching. Subsequently, a thermal oxidation is performed to expand the volume of the polysilicon layer thereby narrowing the opening. The opening is smaller than the original opening generated by the patterning and etching, which will increase the accuracy of a opening.

14 Claims, 3 Drawing Sheets

1

METHOD FOR MANUFACTURING AN ALIGNED OPENING IN AN INTEGRATED CIRCUIT

FIELD OF THE INVENTION

The present invention relates to a method of fabricating a semiconductor device, 5 and more specifically, to a method of forming an aligned opening in the semiconductor device.

BACKGROUND OF THE INVENTION

It has been the trend in integrated circuit technology to increase the density of semiconductor devices per unit area of silicon wafer. It follows then that the semiconductor devices, such as transistors and capacitors, must be made smaller and smaller. However, one area which poses as a significant barrier to the miniaturization of semiconductor devices is photolithography. In particular, the problem of "registration" accuracy arises. Registration refers to the aligning of a mask to the semiconductor wafer to ensure that the mask is correctly positioned atop the features of the wafer. For a further discussion of registration, the reader is invited to review *Silicon Processing for the VLSI Era, Vol. 1 —Process Technology*, S. Wolf and R.N. Tauber, Lattice Press, 1986, pp. 473–476.

The registration problem arises when, for example, semiconductor MOSFET transistors become very small. For discussion, assume the dimension of the channel underneath the gate of the transistor is smaller than 0.5 micron. In certain types of transistors, such as floating gate transistors, it is important to align an opening precisely atop the gate. This is required, in this case, to separate the contacts between the source and the drain of the transistor.

The masking of the photoresist needs to be extremely accurate in order for a contact opening to be aligned precisely atop of the gate. If the photoresist is not correctly aligned with the gate, then a trench is formed in the substrate and in the field oxide edge which results in probable failure, or degradation in the performance, of the transistor during operation. Currently, the registration tolerance of modern photolithography is on the order of 0.05–0.2 microns. Therefore, if the gate is in the sub 0.5 micron range, the mask may not align precisely over the gate due to registration errors.

To illustrate the effect of misalignment as discussed above, FIG. 1 shows a transistor formed from a misaligned opening. A MOS transistor and field oxide region 4 are formed on a semiconductor substrate 2. The MOS transistor comprises a gate oxide 6, a polysilicon gate 8, a capped oxide 10 and side wall spacers 12. Source and drain regions (not shown) are formed in the substrate 2 and border both sides of the gate 8.

A polysilicon layer 14 is then deposited on the substrate 2, the MOS transistor and on the field oxide region 4. As is known in the art, the polysilicon layer 14 is typically used to form electrical connections to the source and drain of the transistor. Next, a photoresist 16 is deposited on the polysilicon layer 14. A mask is then typically used to soften the photoresist 16 in predetermined locales for etching. Finally, an etching process is performed to form openings 18. However, because of the misalignment of the mask, during the etching process, trenches 20 are generated on the substrate 2. Oftentimes, the misalignment will lead to failure of the transistor.

The present invention solves these and other problems of the prior art.

SUMMARY OF THE INVENTION

A method of forming an aligned opening over a gate of a MOS transistor is disclosed. The method comprises the steps of forming a contact polysilicon layer on said MOS transistor, forming a dielectric layer on said contact polysilicon layer, forming an expansion polysilicon layer on said dielectric layer, etching said expansion polysilicon layer to form an opening in said expansion polysilicon layer, said opening generally aligned above said gate, oxidizing said expansion polysilicon layer into a polysilicon-oxide layer that is expanded in volume relative to said expansion polysilicon layer thereby narrowing said opening, and using said polysilicon-oxide layer as an etching mask to etchback said dielectric layer and said contact polysilicon layer to form said aligned opening.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

In the present invention, a new method is disclosed to form aligned openings. The formation of the aligned openings includes many process steps that are well known in the art. For example, the process of photolithography masking and etching is used extensively herein. This process consists of creating a photolithography mask containing the pattern of the component to be formed, coating the wafer with a light sensitive material known as a photoresist, exposing the photoresist coated wafer to ultra-violet light through the mask to soften or harden parts of the photoresist (depending on whether positive or negative photoresist is used), removing the softened parts of the photoresist, etching to remove the materials left unprotected by the photoresist and stripping the remaining photoresist. This photolithography masking and etching process are referred to as "patterning and etching." Additionally, it should be pointed out that the method described herein includes many conventional process steps that are well known in the art. Each of these steps are conventional and will not be described in detail herein.

Figure 1:
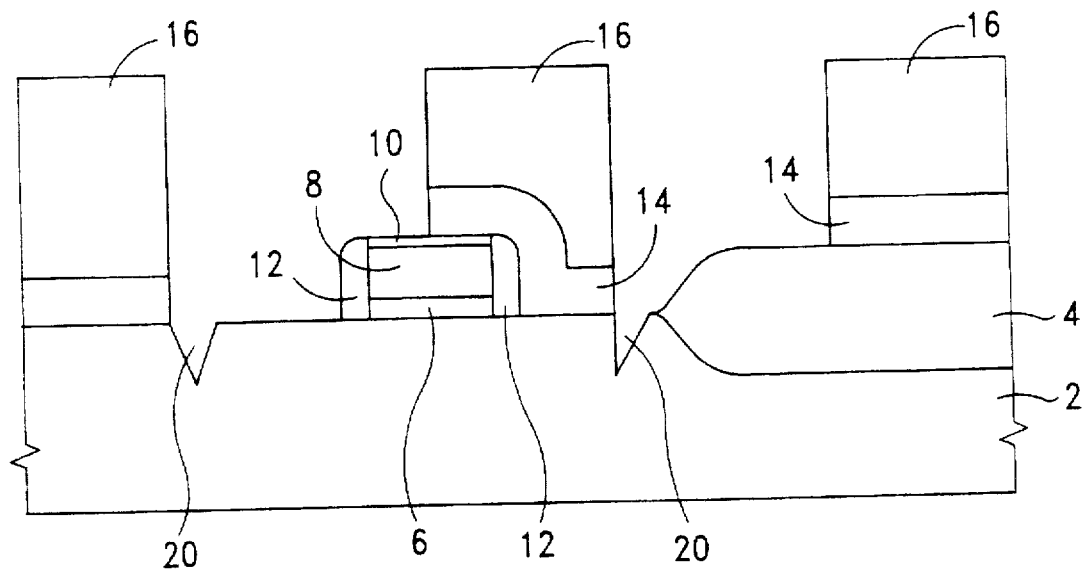
FIG. 1 is a cross section view of a MOS transistor having misaligned openings.
Figure 2:
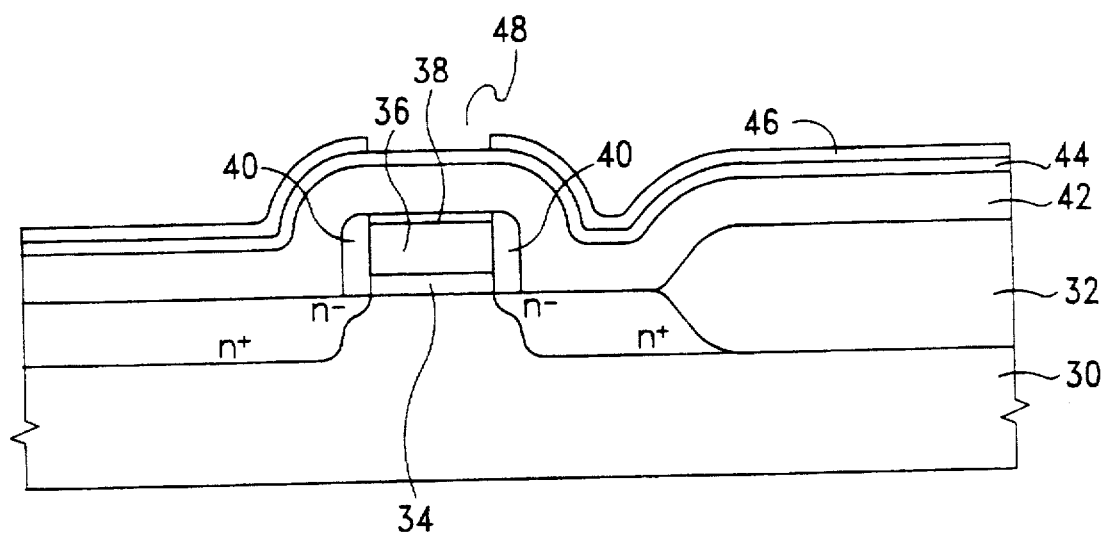
FIG. 2 is a cross section view of a semiconductor wafer illustrating an intermediate step in the method of the present invention.

Turning to FIG. 2, a single crystal substrate 30 is used. Preferably, the single crystal substrate 30 is P-type with a <100> crystallographic orientation. A thick field oxide region (FOX) 32 is created for purposes of isolation Generally speaking, the FOX 32 region is created via photolithography and dry etching steps to etch a silicon nitride-silicon dioxide composite layer. After the photoresist is removed and wet cleaned, a thermal oxidation in an oxygen-steam ambient is used to form the FOX 32 region, to a thickness of about 3000–6000 angstroms.

Initially, a first silicon dioxide layer 34 is created atop the substrate 30 to act as the gate oxide. In the preferred embodiment, the first silicon dioxide layer 34 is formed by using an oxygen-steam ambient, at a temperature between about 850° to 1000° C. Alternatively, the gate oxide may be formed using other known oxide chemical compositions and procedures. As is known in the art, by controlling the pressure and time at which the oxygen-steam ambient is exposed to the substrate the thickness of the silicon dioxide layer 34 can be easily controlled. In the preferred embodiment, the thickness of the first silicon dioxide layer 34 is approximately 50–200 angstroms.

Still referring to FIG. 2, after the first silicon dioxide layer 34 is formed, a first polysilicon layer 36 is formed over the first silicon dioxide layer 34 and the field oxide regions 32. In the preferred embodiment, the first polysilicon layer 36 is formed by using conventional chemical vapor deposition (CVD) to have a thickness about 2000–4000 angstroms.

Next, a capped oxide layer 38 is formed atop the first polysilicon layer 36 for the purpose of electrically isolating the first polysilicon layer 36. Thus, in this example, the MOS transistor being formed is a floating-gate transistor. The thickness of the capped layer is about 1000–1500 angstroms. Subsequently, side wall spacers 40 are formed by depositing a second silicon dioxide layer on the substrate, then an anistropic etching is performed to etchback the second silicon dioxide. Similarly, the second silicon dioxide layer can be formed by using TEOS or any other well known process. Of course, the lightly doped drain structure is formed prior to the side wall spacers via ion implantation. Finally, ion implantation is performed again to form the impurity regions i.e. the source and the drain. The formation of the floating gate transistor described above is well known in the art.

Still referring to FIG. 2, a second polysilicon layer 42 is formed atop the MOS transistor and the field oxide region 32. The thickness of the second polysilicon layer 42 is preferably approximately 1000–4000 angstroms. In the preferred embodiment, the second polysilicon layer 42 is formed by using conventional chemical vapor deposition (CVD). Portions of the second polysilicon layer will be used as electrical connections for the source and drain of the MOS transistor. The second polysilicon layer is also referred to as the contact polysilicon layer.

Next, a dielectric layer 44 is deposited on the second polysilicon layer 42 to have a thickness about 500–1500 angstroms. In the preferred embodiment, the first dielectric layer is composed of nitride. The nitride dielectric layer 44 acts as an isolation layer to prevent the second polysilicon layer 42 from contacting with a later deposited layer.

To wit, a third polysilicon layer 46 is formed on the nitride layer 44 to have a thickness of a range about 300–1000 angstroms. Similarly, a CVD process is used to form the third polysilicon layer 46. Then patterning and etching steps are used to etch the third polysilicon layer 46 to the surface of the nitride layer 44. Optimally, the masking is aligned with the gate of the MOS transistor (the gate is also referred to as a "feature" that an opening is intended to cover). An opening 48, which is nearly aligned with the gate, is formed in the third polysilicon layer 46. As will be seen in greater detail below, even if the opening 48 is not currently aligned with the gate exactly, the further process steps will ensure that the opening 48 will be aligned.

Figure 3:
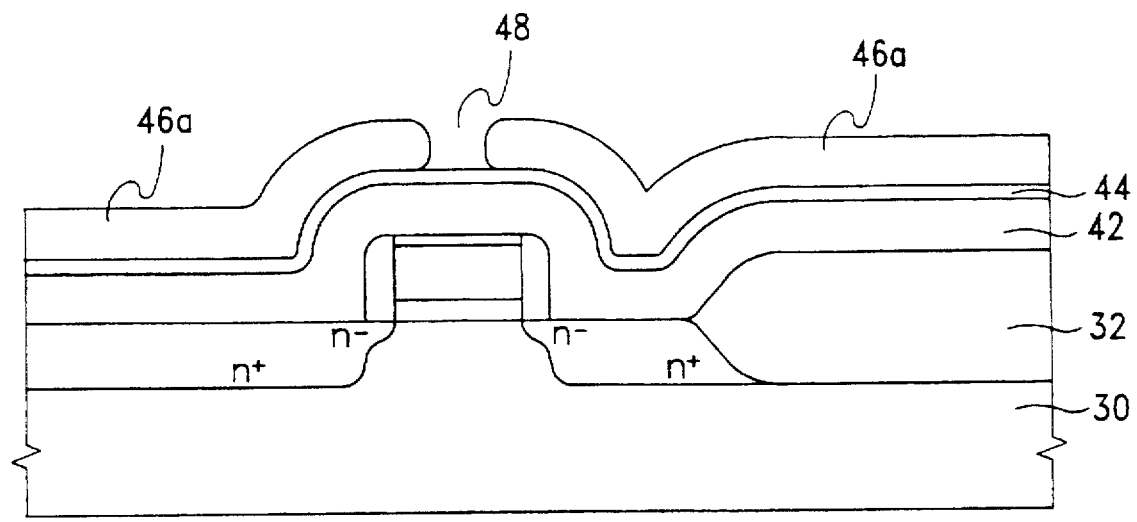
FIG. 3 is a cross section view of a semiconductor wafer illustrating the step of oxidizing the third polysilicon layer in accordance with the present invention.

Turning to FIG. 3, a thermal oxidation step is performed to oxidize the third polysilicon layer 46. The oxidation process expands the volume of the third polysilicon layer 46 thereby narrowing the opening 48, and the polysilicon layer 46 is transformed to a polysilicon-oxide layer 46a. The thermal oxidation is performed in an oxygen-steam ambient, at a temperature between about 850° to 1000° C. The opening dimension after the oxidation is beyond the photolithography registration tolerance. In other words, by "squeezing" the opening 48 by the thermal oxidation step, any misalignment in the masking step will be made irrelevant.

To further explain, assume that the gate size is 0.5 microns. Assume further that the registration tolerance of the photolithography process is 0.2 microns. Finally, assume a worst case scenario where the opening 48 of the third polysilicon layer 46 formed by photolithography is 0.2 microns shifted off of the gate. Left uncorrected, the etching step would result in a trench being formed in either the source or drain of the MOS transistor. However, by adding the thermal oxidation step, the opening 48 is narrowed by, for example, 0.4 microns (0.2 microns on both sides of opening 48). The opening 48 is now 0.1 microns in width with none of the opening 48 over the source or the drain. Although the opening 48 is considerably smaller, i.e. 0.1 microns, in some applications such as a floating gate MOS transistor, this opening is adequate to isolate the source from the drain.

Figure 4:
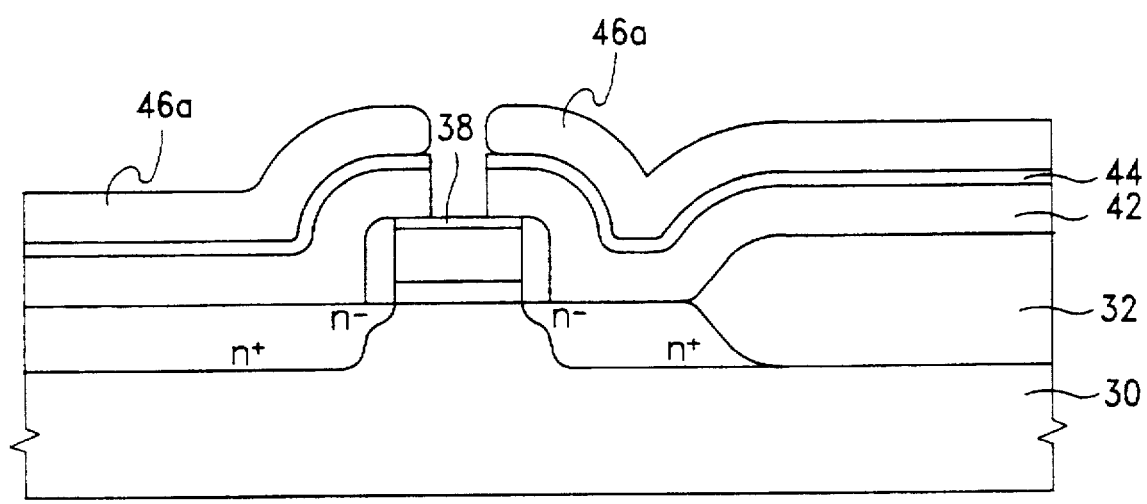
FIG. 4 is a cross section view of a semiconductor wafer illustrating the step of etching said nitride layer and the second polysilicon layer in accordance with the present invention.

Turning to FIG. 4, the next step in the manufacturing process is to use the polysilicon-oxide 46a as an etching mask to remove the nitride layer 44 and the second polysilicon layer 42 over the gate. The nitride layer 44 and the second polysilicon layer 42 are etch down to the surface of the capped oxide layer 38. In one embodiment, SF can be used as the reaction gas because of its high etching selectivity between polysilicon and oxide.

Figure 5:
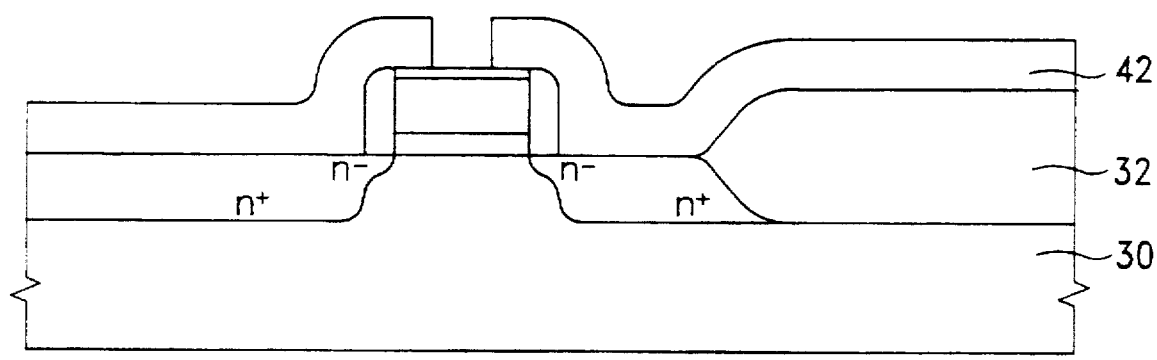
FIG. 5 is a cross section view of a semiconductor wafer illustrating the step of removing a polysilicon-oxide layer and the nitride layer in accordance with the present invention.

Finally, turning to FIG. 5, etching steps are used to remove the polysilicon-oxide layer 46a and the nitride layer 44. In preferred embodiment, The polysilicon-oxide layer 46a is removed by HF solution. The nitride layer 44 is removed by hot phosphorus acid solution ($H_3 PO_4$).

As is understood by a person skilled in the art, the foregoing preferred embodiment of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. For example, the present invention has been described in terms of forming an aligned opening over the gate of a MOS transistor, the present invention could be applied to the formation of an aligned opening over any feature in a semiconductor device. Thus, while the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming an aligned opening over a gate of a MOS transistor, said method comprising the steps of:

forming a contact polysilicon layer on said MOS transistor;

forming a dielectric layer on said contact polysilicon layer;

forming an expansion polysilicon layer on said dielectric layer;

etching said expansion polysilicon layer to form an opening in said expansion polysilicon layer, said opening generally aligned above said gate;

oxidizing said expansion polysilicon layer into a polysilicon-oxide layer that is expanded in volume relative to said expansion polysilicon layer thereby narrowing said opening; and using said polysilicon-oxide layer as an etching mask to etchback said dielectric layer and said contact polysilicon layer to form said aligned opening.

2. The method of claim 1 further including the steps of removing said polysilicon-oxide layer and removing said dielectric layer.

3. The method of claim 1 further including the step of forming a capped oxide layer atop of said gate.

4. The method of claim 1 wherein said dielectric layer is composed of nitride.

5. The method of claim 3 further including the step of forming sidewall spacers on the sides of said gate.

6. The method of claim 1, wherein said expansion polysilicon layer is formed to have a thickness of approximately 300–1000 angstroms.

7. The method of claim 3, wherein said dielectric layer and said expansion polysilicon layer are etched down to the surface of said capped oxide layer.

8. The method of claim 2, wherein said polysilicon-oxide is removed by using HF solution.

9. The method of claim 2, wherein said dielectric layer is removed by using hot phosphorus acid solution ($H_3PO_4$).

10. A method of forming an aligned opening over a feature in a semiconductor substrate, the method comprising the steps of:

(a) forming a layer of expansion polysilicon at least over said feature;

(b) masking and etching an approximate opening in said layer of expansion polysilicon over said feature; and (c) oxidizing said polysilicon into a polysilicon-oxide layer that is expanded in volume relative to said expansion polysilicon layer thereby narrowing said approximate opening into said aligned opening.

11. The method of claim 10 further including the step of forming a dielectric layer between said expansion polysilicon layer and said feature.

12. The method of claim 11 further including the step of etching back said dielectric layer away from said feature through said aligned opening.

13. The method of claim 10 wherein said step of oxidizing is thermal oxidation in an oxygen-steam ambient at a temperature of 850° to 10000° C.

14. The method of claim 10, wherein said expansion polysilicon layer is formed to have a thickness of approximately 300–1000 angstroms.

* * * * *